United States Patent [19]

Chow et al.

[11] 4,333,965

[45] Jun. 8, 1982

[54] METHOD OF MAKING INTEGRATED CIRCUITS

[75] Inventors: Tat-Sing P. Chow, Schenectady; Mario Ghezzo, Ballston Lake, both of N.Y.

[73] Assignee: General Electric Company, Schenectady, N.Y.

[21] Appl. No.: 187,501

[22] Filed: Sep. 15, 1980

[51] Int. Cl.³ .................... B05D 5/12; H01L 21/306
[52] U.S. Cl. ................................. 427/93; 156/643; 156/649; 427/94; 427/96; 430/313; 430/318
[58] Field of Search .............. 156/643, 649; 427/93, 427/94, 96; 430/313, 318

[56] References Cited

U.S. PATENT DOCUMENTS 4,110,125 8/1978 Beyer .......................... 427/93 X

FOREIGN PATENT DOCUMENTS 2798 9/1979 Fed. Rep. of Germany ........ 427/94

*Primary Examiner*—Michael R. Lusignan
*Attorney, Agent, or Firm*—Julius J. Zaskalicky; James C. Davis, Jr.; Marvin Snyder

[57] ABSTRACT

A method of reducing lateral field oxidation in the vicinity of the active regions of a silicon substrate in which integrated circuit elements are to be formed. Mesas, the tops of which are the active regions, are formed by ion beam etching of the silicon substrate. The mesas are protected by caps of silicon nitride overlying the top and sides of the mesas during field oxide formation. Subsequently the caps of silicon nitride are removed and the exposed sides of the mesas are oxidized to form a thick layer of silicon dioxide contiguous to the mesas.

7 Claims, 10 Drawing Figures

METHOD OF MAKING INTEGRATED CIRCUITS

The present invention relates in general to a method of making integrated circuits and more particularly for providing on a silicon substrate a thick layer of silicon dioxide contiguous to a surface adjacent region of the substrate.

Integrated circuits include a plurality of active components, dielectrically isolated on a common silicon substrate. In the making of such circuits the active regions of the silicon substrate on which the active components are formed are masked by a thin layer of silicon dioxide on which is formed a thicker layer of silicon nitride. The retained portion of the layer of silicon nitride serves as a mask for etching exposed portions of the layer of silicon dioxide, for etching recesses in the silicon substrate surrounding the active region and for the subsequent oxidation of the silicon in the recesses to form a field oxide which provides the dielectric isolation. The thin layer of silicon dioxide covering the active region of the substrate is provided to buffer the mismatch in thermal expansion between the silicon substrate and the silicon nitride masking layer during processing.

In the oxidation step passage of oxygen laterally through the thin layer of oxide causes growth of oxide in the outer portions of the surface of each of the active regions and produces lateral protrusions of oxide referred to in the art as "bird's beak" formations. The "bird's beak" formation occurs even when the layer of silicon nitride is made sufficiently thick to resist bending thereof. The "bird's beak" formation represents a transition region of silicon dioxide between the edge of an active region of reduced surface dimensions to the edge of the field oxide region. With a "bird's beak" formation, curvature is also produced in the surface of the active region. Thus, the "bird's beak" formations result not only in shifting the edge of the active region but also result in a substantial reduction in usable surface of the substrate for the fabrication of active components thereon.

An object of the present invention is to provide a method for substantially eliminating "bird's beak" formations in the fabrication of integrated circuits.

Another object of the present invention is to provide a relatively simple method of forming active regions of improved planarity and increased density in integrated circuits.

In carrying out the method of the present invention in accordance with one embodiment thereof, a substrate of semiconductor material having a major surface is provided. A first thin layer of silicon dioxide is formed on the major surface of the substrate. A second thick layer of silicon nitride is formed on the first layer of silicon dioxide. A third layer of an ion erosion resistant material is formed on the second layer of silicon nitride. The third layer of ion erosion resistant material is patterned to produce a retained portion overlying and in registry with an active region of the substrate adjacent the major surface thereof. The second and first layers are patterned using the retained portion of the third layer as a mask by ion beam etching orthogonally to the plane of the major surface to produce retained portions of the second and first layers each overlying and in registry with the active region of the major surface and to remove portions of the substrate to form a mesa the top of which is the active region. The retained portion of the third layer is removed. A fourth layer of silicon nitride is deposited over the exposed portions of the substrate including the side walls of the mesa and the retained portions of the first and second layers. The portions of the fourth layer of silicon nitride contiguous to and overlying the portions of the substrate parallel to said major surface are removed. The substrate is heated in an oxidizing atmosphere to a temperature and for a time to cause exposed portions of the substrate to be converted to silicon dioxide. The retained portion of the layers of silicon nitride covering the mesa are removed to expose the side walls thereof. The substrate is heated to cause exposed portions of the side walls of the mesa to be converted to silicon dioxide.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

Figure 1:
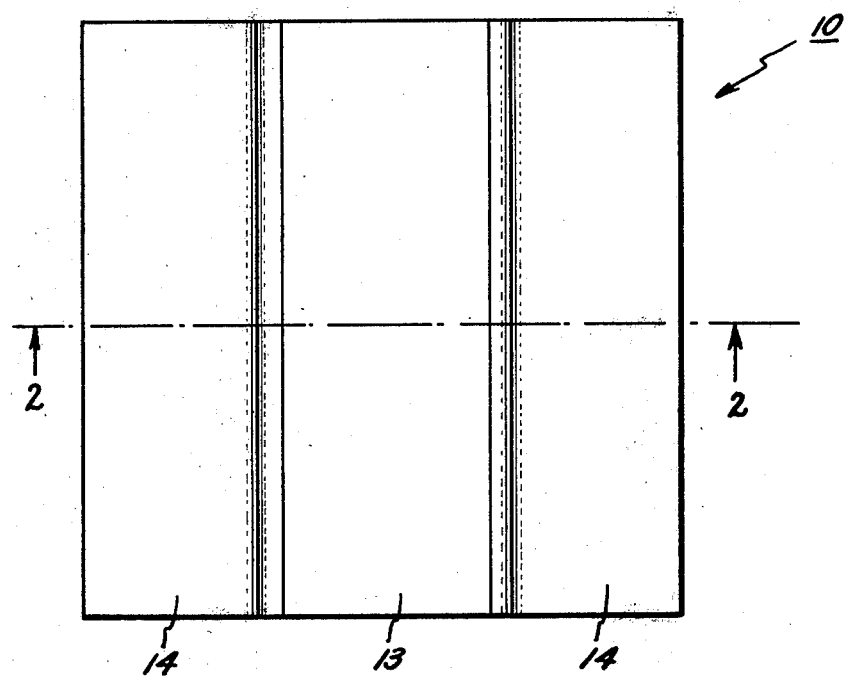
FIG. 1 is a plan view of a composite body representing a section of an integrated circuit showing a silicon substrate on which is formed a single active region surrounded by a thick isolating layer of silicon dioxide.
Figure 2:
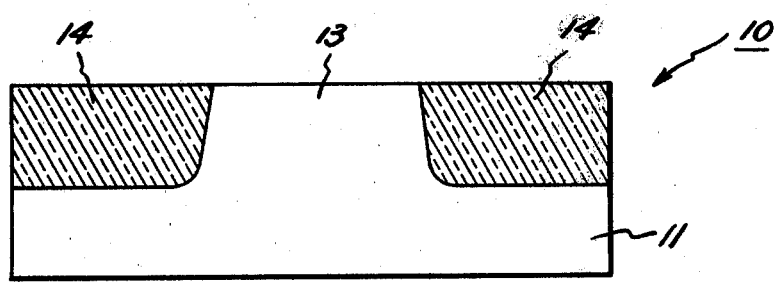
FIG. 2 is a cross-sectional view of the section of the substrate of FIG. 1 taken along section lines 2—2 thereof.

Referring now to FIGS. 1 and 2, there is shown a composite body 10 representing a part of an integrated circuit made in accordance with the present invention. The composite body 10 includes a substrate 11 having a major surface in which is provided an active region 13 surrounded by a thick isolating layer of silicon dioxide 14. Active components of devices, such as field effect transistors (not shown), are formed in the active region and are isolated from other such active components formed on the substrate by the thick layer 14 of silicon dioxide.

Figure 3A:
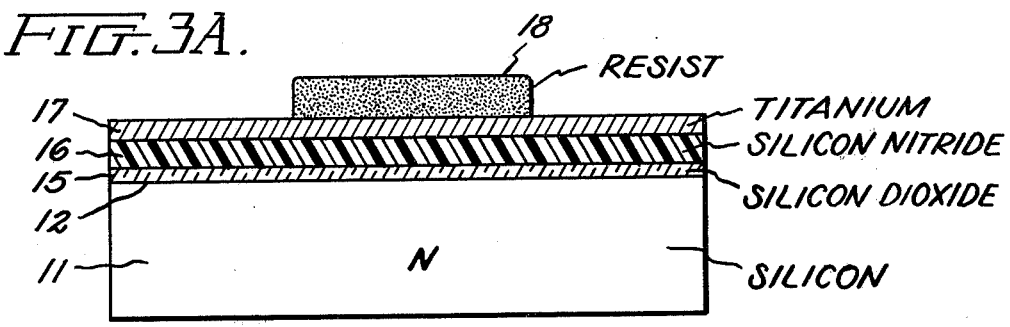
FIGS. 3A–3H show cross sections of structures representing successive steps in one method of fabricating the composite structure of FIGS. 1 and 2 in accordance with the present invention.
Figure 3B:
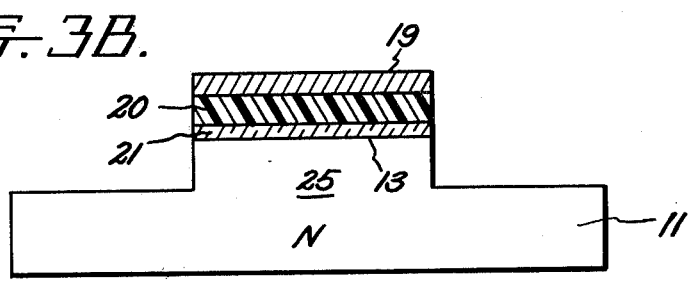
Figure 3C:
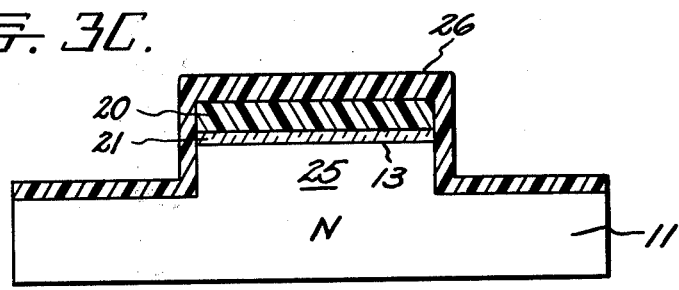
Figure 3D:
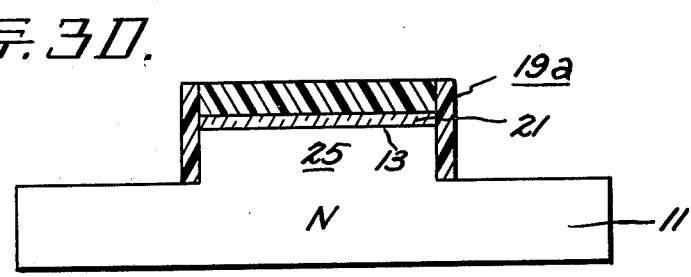
Figure 3E:
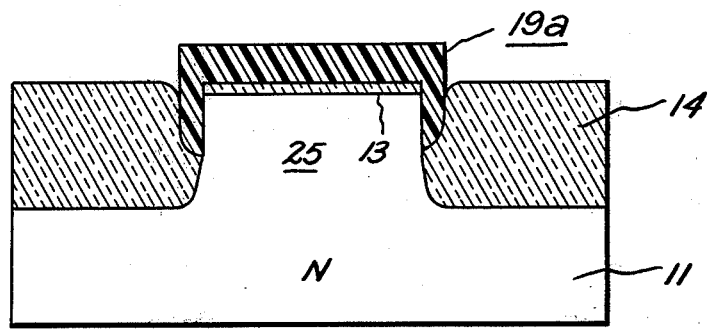
Figure 3F:
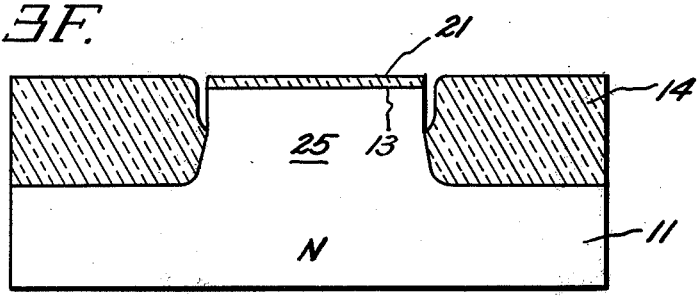
Figure 3G:
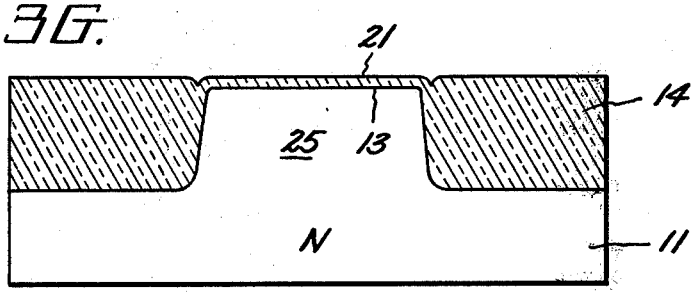
Figure 3H:
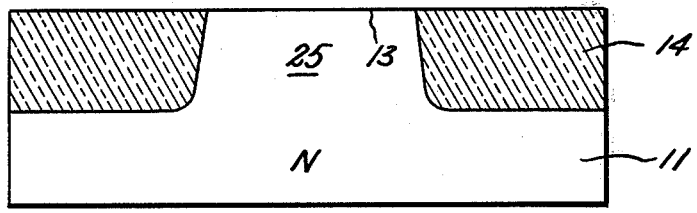

A method of fabricating the composite structure of FIGS. 1 and 2 in accordance with the present invention will now be described in connection with FIGS. 3A–3H. Elements of FIGS. 3A–3H identical to elements of FIGS. 1 and 2 are identically designated. A substrate 11 of silicon semiconductor material of 10 ohm-cm resistivity and N-type conductivity having a major surface 12 parallel to a (100) crystallographic plane thereof is provided. A first layer 15 of silicon dioxide about 300 Angstroms thick is formed on the major surface 12 by techniques well known in the art, as shown in FIG. 3A. For example, the silicon substrate is exposed in an ambient of oxygen at atmospheric pressures and at a temperature of about 1000° C. for a period of 30 minutes. A second layer 16 of silicon nitride is deposited on the surface of the first layer of silicon dioxide by chemical vapor deposition. In this process vapors of silane and ammonia in the ratio of 1 to 200 by volume are utilized at a temperature of 1000° C. in hydrogen carrier and for a time period of 10 minutes to form a layer of silicon nitride about 1000 Angstroms thick. A third layer of an ion erosion resistant material, such as titanium, about 1000 Angstroms thick is then evaporated over the second layer of silicon nitride. The third layer of titanium 17 is patterned utilizing photolithographic masking and plasma etching techniques well known in the art to provide a retained portion which overlies and is in registry with the active region 13 of the substrate. The width of the active region 13 may be as small as about 1 micron. A suitable photoresist such as an azide resist AZ 1470 available from the Shipley Co. of Newton, Mass. is applied over the third layer 17 of titanium. After exposure and developing of the photoresist to provide a retained portion 18 thereof, the exposed portions of the layer of titanium unprotected by the photoresist are plasma etched, for example, using carbon tetrachloride, to provide the retained portion 19 of the layer 17 of titanium. Next, the retained portion 18 of photoresist is removed by means of a suitable photoresist stripper. Then the second layer 16 of silicon nitride unmasked by the retained portion 19 of the layer of titanium is ion beam etched or ion milled, orthogonally with respect to the major surface 12 as shown in FIG. 3B, to provide a retained portion 20 in registry with the active region 13. Ion milling is done in argon with about 1% of oxygen. The oxygen addition converts titanium to titanium dioxide which has a very low etch rate and hence better ion beam masking qualities. The first layer 15 of silicon dioxide unmasked by the retained portion of the second layer of silicon dioxide is also ion milled orthogonally with respect to the major surface 12 to provide a retained portion 21 in registry with the active region 13 and exposing a portion of the major surface 12 of the substrate 11. The surface portion of the substrate underlying the unmasked portions of the first layer of silicon dioxide is also ion milled orthogonally with respect to the major surface 12 of the substrate to a predetermined depth. The depth of ion milling of the silicon substrate is selected such that subsequent regrowth of silicon dioxide in the recesses of the substrate is sufficiently thick to provide a surface thereof essentially coplanar with the surface of the active region. To attain such a condition the depth of milling is set to approximately 57% of the resultant thickness of the thick layer 14 of silicon dioxide. The ion milling of the substrate orthogonally to the plane of the major surface forms a mesa 25 in the substrate the top of which is the aforementioned active region. The retained portion 18 of the titanium layer is then removed using buffered hydrofluoric acid. Next, a fourth layer 26 of silicon nitride about 1000 Angstroms thick is deposited over exposed portions of the substrate including the side walls of the mesa and the retained portions of the first and second layers. Thereafter, portions of the fourth layer 26 of silicon nitride contiguous to and overlying the major surface of the substrate are removed by ion milling exposing the substrate and leaving retained portion 19a surrounding the top and sides of the mesa 25. In the next step of the process, the substrate is heated in an oxidizing atmosphere to a temperature and for a time to cause the exposed portions of the substrate, that is, the recessed or the milled out portions, to be converted to a thick layer 14 of silicon dioxide substantially coplanar with the surface of the active region 13, as shown in FIG. 3E. Thereafter, the retained portion 19a of silicon nitride, overlying and also surrounding the side walls of the mesa 25 is removed utilizing a suitable etch, such as hot phosphoric acid to provide the resultant structure shown in FIG. 3F. The substrate is then heated to cause exposed portions of the side walls of the mesa to be converted to silicon dioxide, as shown in FIG. 3G. The retained portion 21 of silicon dioxide and the surface adjacent portions of the thick layer 14 of silicon dioxide are removed using a suitable etch such as buffered hydrofluoric acid to expose the top surface of the mesa 25 and to remove irregularities and undulations in the surface of the thick layer 14 of silicon dioxide as shown in FIG. 3H.

Particular advantages of the structure are that the surface portion of the active region 13 retains its size and location on the major surface of the substrate essentially as assigned prior to the processing of the substrate with minimum shrinkage thereof due to the processing of the substrate to form the dielectric isolating layer 14 in accordance with the present invention. Minimizing the formation of "bird's beak" enables the planarity of the surface region to be maintained as well. At this point in the process, active devices or components, such as field effect transistors, may be readily formed in the active regions by processes well known to those skilled in the art.

While in the process described above titanium is used as the ion erosion resistant material, other ion erosion resistant materials such as aluminum can be used.

While in the process described above, specific thicknesses for the first thin layer of silicon dioxide, for the second thick layer 16 of silicon nitride and for the fourth thick layer 26 of silicon nitride are used, it will be understood that a range of thicknesses may be utilized for these layers. A suitable range for the thickness of the first thin layer of silicon dioxide is from about 50 to about 400 Angstroms. A suitable range for the thickness of the second thick layer of silicon nitride is from about 500 to about 1500 Angstroms. A suitable range for the thickness of the fourth thick layer is from about 500 to about 1500 Angstroms.

While in the process described above the fourth layer of silicon nitride is deposited directly on the exposed sides of the silicon mesa, it may be desirable to form a thin layer of silicon dioxide on the exposed side surfaces of the mesa prior to the deposition of the fourth layer of silicon nitride to minimize the thermal stresses produced in the side walls of the mesa due to mismatch in the thermal expansion between the silicon surface and the layer of silicon nitride. To this end a layer of silicon dioxide in the range from about 50 to about 400 Angstroms thick would be provided on the side surfaces of the mesa, for example by thermal oxidation, prior to the deposition of the fourth layer of silicon nitride.

While in the process described above, a silicon substrate of N-type conductivity is utilized, it, of course, is apparent that P-type conductivity substrates as well can be utilized.

While the invention has been described in a specific embodiment, it will be understood that modifications, such as those described above, may be made by those skilled in the art and it is intended by the appended claims to cover all such modifications and changes as fall within the true spirit and scope of the invention.

What is claimed is:

1. The method of providing in a substrate of semiconductor material having a major surface a thick layer of silicon dioxide contiguous to a region of said substrate adjacent said major surface comprising:

providing said substrate of silicon semiconductor material having a major surface, forming a first thin layer of silicon dioxide on said major surface, forming a second thick layer of silicon nitride on said first layer of silicon dioxide, forming a third layer of an ion erosion resistant material on said second layer of silicon nitride, patterning said third layer of ion erosion resistant material to produce a retained portion overlying and in registry with said region of said major surface, patterning said second and first layers using said retained portion of said third layer as a mask by ion beam etching orthogonally to the plane of said major surface to produce retained portions of said second and first layers each overlying and in registry with said region of said major surface and to remove portions of said substrate to form a mesa the top of which is said region, removing said retained portion of said third layer, depositing a fourth layer of silicon nitride over exposed portions of said substrate including the side walls of said mesa and said retained portions of said first and second layers, removing the portions of said fourth layer of silicon nitride contiguous to and overlying said major surface of said substrate, heating said substrate in an oxidizing atmosphere to a temperature and for a time to cause exposed portions of said substrate to be converted to a thick layer of silicon dioxide, removing the portions of said second and fourth layers of silicon nitride covering said mesa to expose the side walls thereof, heating said substrate to cause exposed portions of the side walls of said mesa to be converted to silicon dioxide.

2. The method of claim 1 in which said retained portion of said first layer of silicon dioxide is removed.

3. The method of claim 1 in which the exposed surface of said thick layer of silicon dioxide is substantially parallel with the exposed surface of said retained portion of said first layer of silicon dioxide, and in which said retained portion of said first layer and a thin portion of said thick layer of silicon dioxide are removed to expose said region of said substrate and planarize the surface of said thick layer of silicon dioxide.

4. The method of claim 1 in which said erosion resistant material is titanium.

5. The method of claim 1 in which said erosion resistant material is aluminum.

6. The method of claim 1 in which said first thin layer of silicon dioxide has a thickness in the range from about 50 to about 400 Angstroms, in which said second thick layer of silicon nitride has a thickness in the range from about 500 to about 1500 Angstroms and in which said fourth thick layer of silicon nitride has a thickness in the range from about 500 to about 1500 Angstroms.

7. The method of claim 1 in which prior to the deposition of said fourth layer of silicon nitride, said substrate is heated in an oxidizing atmosphere to a temperature and for a time to cause the exposed side walls of said mesa to be covered with a thin layer of silicon dioxide in the range from about 50 to about 400 Angstroms.

* * * * *